United States Patent
Liaw

(10) Patent No.: US 8,987,831 B2
(45) Date of Patent: Mar. 24, 2015

(54) SRAM CELLS AND ARRAYS

(75) Inventor: Jhon-Jhy Liaw, Zhudong Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 329 days.

(21) Appl. No.: 13/349,349

(22) Filed: Jan. 12, 2012

(65) Prior Publication Data

US 2013/0181297 A1    Jul. 18, 2013

(51) Int. Cl.
*H01L 27/11* (2006.01)
*G11C 11/412* (2006.01)
*H01L 21/8234* (2006.01)
*H01L 21/84* (2006.01)
*H01L 27/02* (2006.01)
*H01L 27/088* (2006.01)
*H01L 27/12* (2006.01)

(52) U.S. Cl.
CPC ...... *G11C 11/412* (2013.01); *H01L 21/823431* (2013.01); *H01L 21/845* (2013.01); *H01L 27/0207* (2013.01); *H01L 27/0886* (2013.01); *H01L 27/1104* (2013.01); *H01L 27/1108* (2013.01); *H01L 27/1211* (2013.01)
USPC ............. 257/390; 257/368; 257/E27.098; 257/E27.099

(58) Field of Classification Search
CPC ............... H01L 21/823431; H01L 27/0886; H01L 27/1211; H01L 27/1104; H01L 27/0207; H01L 27/11; H01L 21/845
USPC ........... 257/368, 390, 393, E27.098, E27.099
See application file for complete search history.

(56) References Cited

U.S. PATENT DOCUMENTS

| 6,271,063 B1 | 8/2001 | Chan et al. |
| 6,867,460 B1 * | 3/2005 | Anderson et al. ............ 257/351 |
| 7,414,877 B2 | 8/2008 | Burnett et al. |
| 2007/0045736 A1 * | 3/2007 | Yagishita ...................... 257/347 |
| 2007/0171700 A1 * | 7/2007 | Burnett et al. ................ 365/154 |
| 2008/0308848 A1 | 12/2008 | Inaba |

FOREIGN PATENT DOCUMENTS

TW    200921911    5/2009

OTHER PUBLICATIONS

Gangwal, S., et al., "Optimization of Surface Orientation for High-Performance Low-Power and Robust FinFET SRAM," IEEE CICC, pp. 433-436, 2006.
Hu, V. P.-H., et al., "FinFET SRAM Cell Optimization Considering Temporal Variablility Due to NBTI/PBTI, Surface Orientation and Various Gate Dielectrics," IEEE Trans. Electron Devices, vol. 58, Issue 3, pp. 805-811, Mar. 2011.
Nackaerts, A., et al., "A 0.314 μm² 6T-SRAM Cell build with Tall Triple-Gate Devices for 45nm node applications using 0.75NA 193nm lithography," IEDM, 2004, pp. 269-272.
"Static random-access memory," Wikipedia, http://en.wikipedia.org/wiki/Static_random-access_memory; Nov. 28, 2011, pp. 1-6.

* cited by examiner

Primary Examiner — Ermias Woldegeorgis
(74) Attorney, Agent, or Firm — Slater & Matsil, L.L.P.

(57) ABSTRACT

Static random access memory (SRAM) cells and SRAM cell arrays are disclosed. In one embodiment, an SRAM cell includes a pull-up transistor. The pull-up transistor includes a Fin field effect transistor (FinFET) that has a fin of semiconductive material. An active region is disposed within the fin. A contact is disposed over the active region of the pull-up transistor. The contact is a slot contact that is disposed in a first direction. The active region of the pull-up transistor is disposed in a second direction. The second direction is non-perpendicular to the first direction.

19 Claims, 12 Drawing Sheets

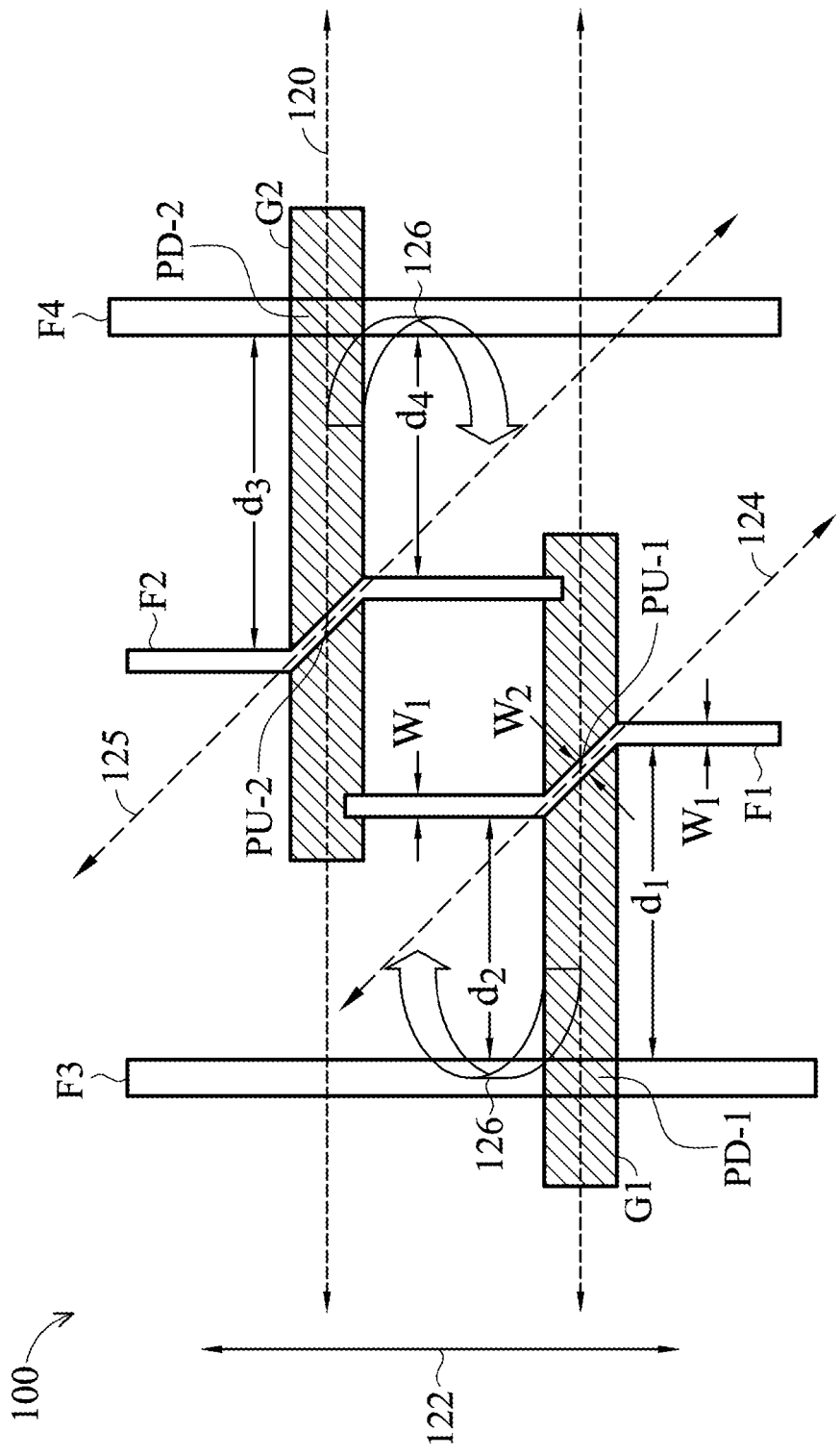

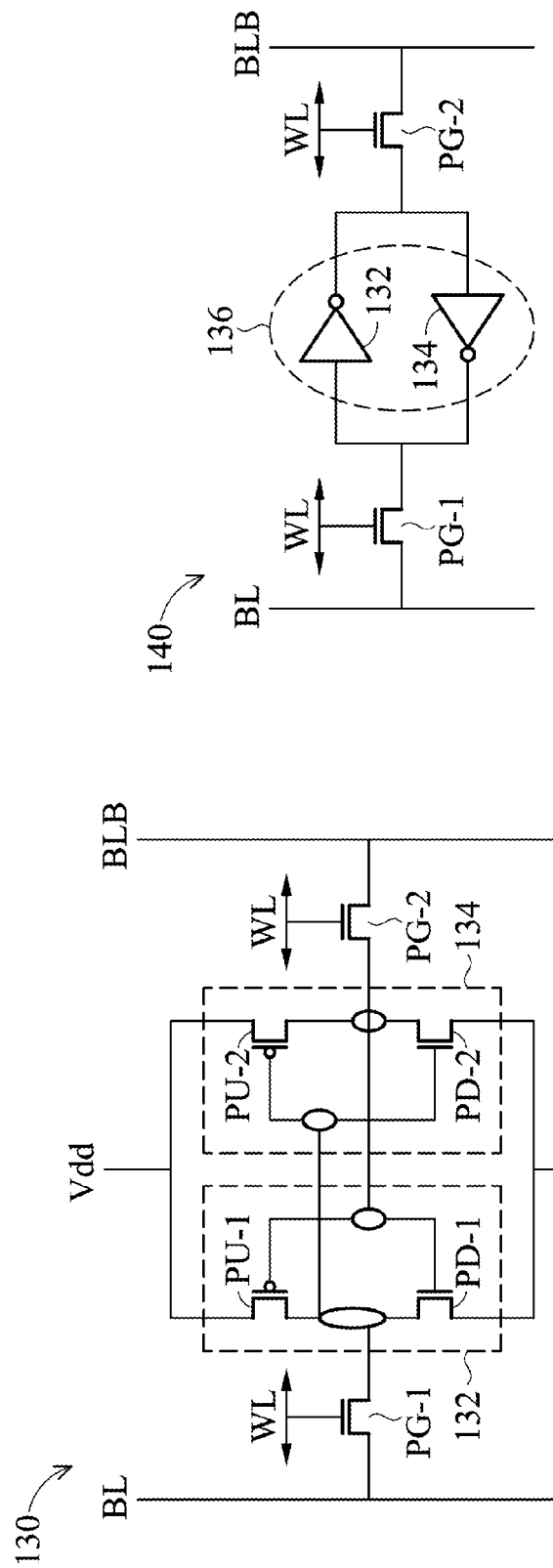

US 8,987,831 B2

SRAM CELLS AND ARRAYS

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

Memory devices are semiconductor devices that are used to store digital information. One type of memory device is a static random access memory (SRAM) device, which is a memory device that does not require periodic refreshing to store information, as do dynamic random access memory (DRAM) devices. SRAM devices use bi-stable latching circuitry to store a bit of data. Some recent designs for SRAM devices utilize Fin Field Effect Transistors (FinFETs) as transistor devices of the SRAM cells. A FinFET is a transistor structure with a fin-like semiconductor channel that is raised vertically out of the semiconductor surface of an integrated circuit.

The semiconductor industry continues to improve the integration density of various electronic components by continual reductions in minimum feature size, which allow more components to be integrated into a given area. It is desirable in many applications to reduce the size of SRAM cells, to improve device performance, reduce power requirements, and allow more SRAM cells to be positioned within a given amount of surface area on an integrated circuit die.

BRIEF DESCRIPTION OF THE DRAWINGS

For a more complete understanding of the present disclosure, and the advantages thereof, reference is now made to the following descriptions taken in conjunction with the accompanying drawings, in which:

FIG. 5 illustrates angles and dimensions of the layout of FIG. 1;

FIG. 6 is a schematic of the SRAM cell layout shown in FIGS. 1 and 2;

FIG. 7 is another schematic of the SRAM cell layout of FIGS. 1 and 2;

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Embodiments of the present disclosure are related to SRAM cells and arrays. Novel layouts for SRAM cells and SRAM cell arrays will be described herein.

Figure 1:
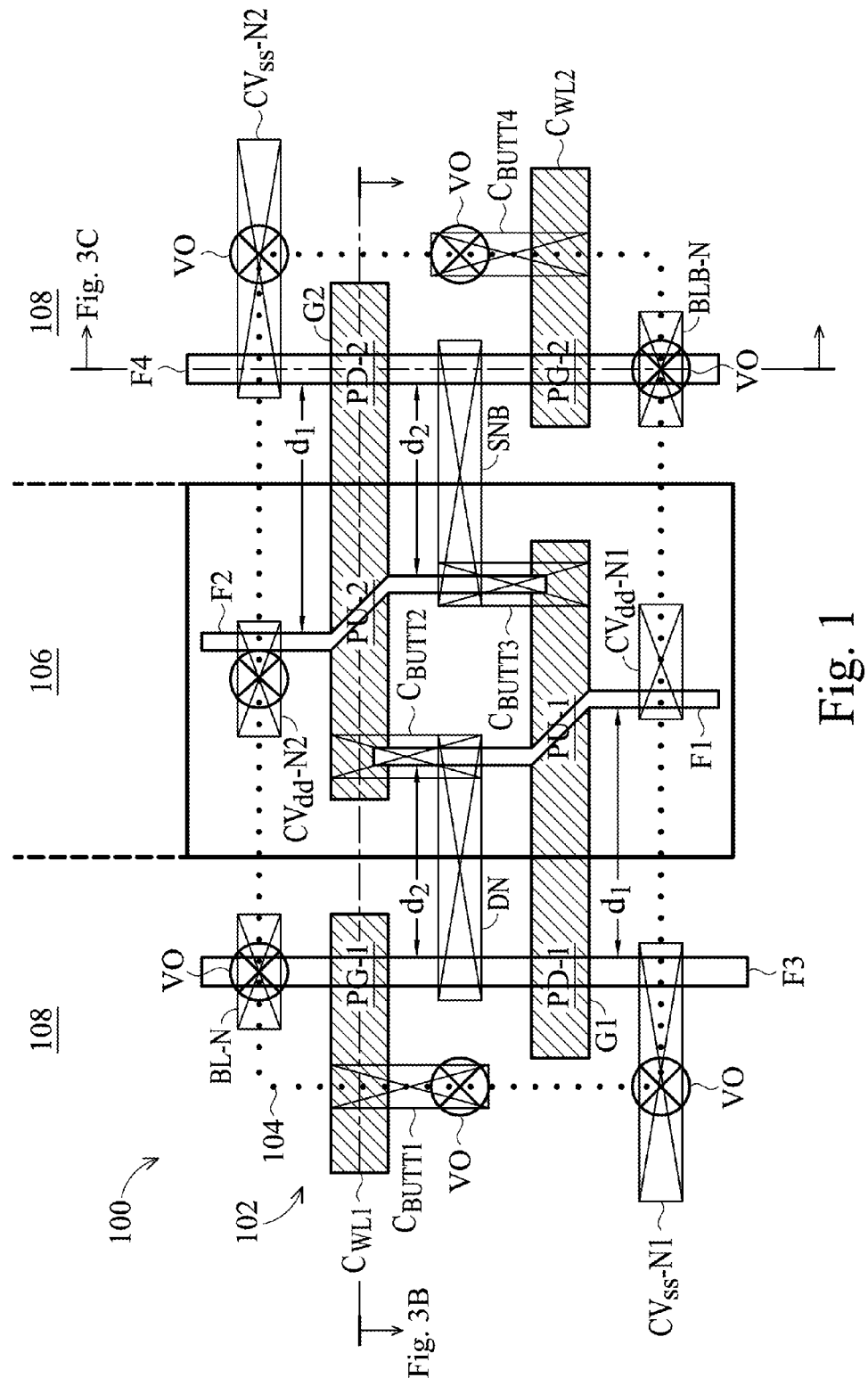
FIG. 1 is a top view of a portion of a novel SRAM cell layout in accordance with an embodiment of the present disclosure.
Figure 2:
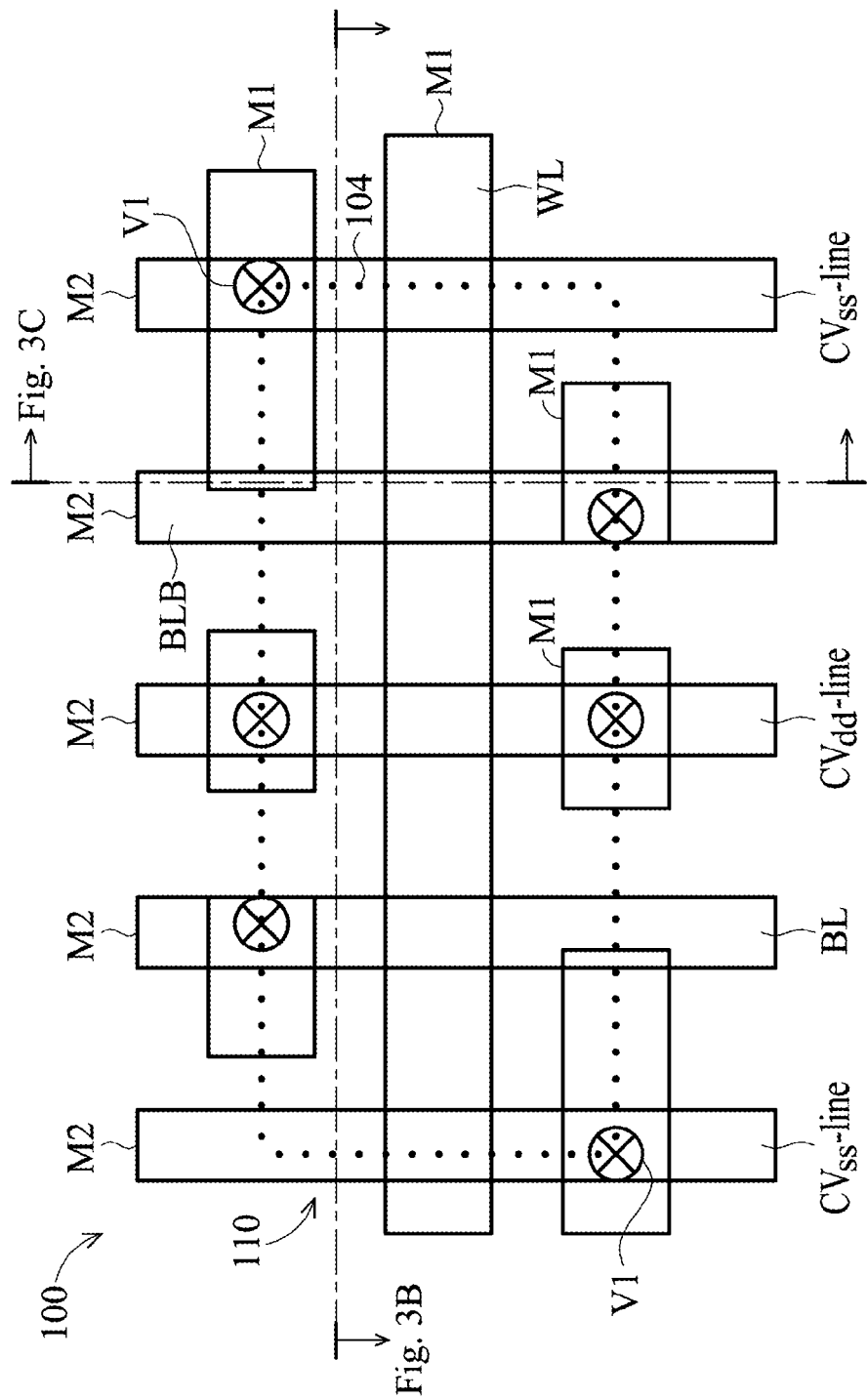
FIG. 2 is a top view of another portion of the SRAM cell layout.

Referring first to FIG. 1, a top view of a SRAM cell layout in accordance with an embodiment of the present disclosure is shown. The view in FIG. 1 shows a front-end-of-line (FEOL) layout 102 for a portion of a semiconductor device 100 comprising a 6 transistor (6T) SRAM cell, wherein an active region of two pull-up transistors PU-1 and PU-2 of the SRAM cell comprises fins F1 and F2 of semiconductive material that are positioned at a non-perpendicular angle with respect to gate electrodes G1 and G2, respectively, disposed over the fins F1 and F2. FIG. 2 is another top view of the 6T SRAM cell layout shown in FIG. 1. A back-end-of-line (BEOL) layout 110 of metallization layers is shown that will overlay the FEOL layout 102 of the 6T SRAM cell shown in FIG. 1.

Figure 3A:
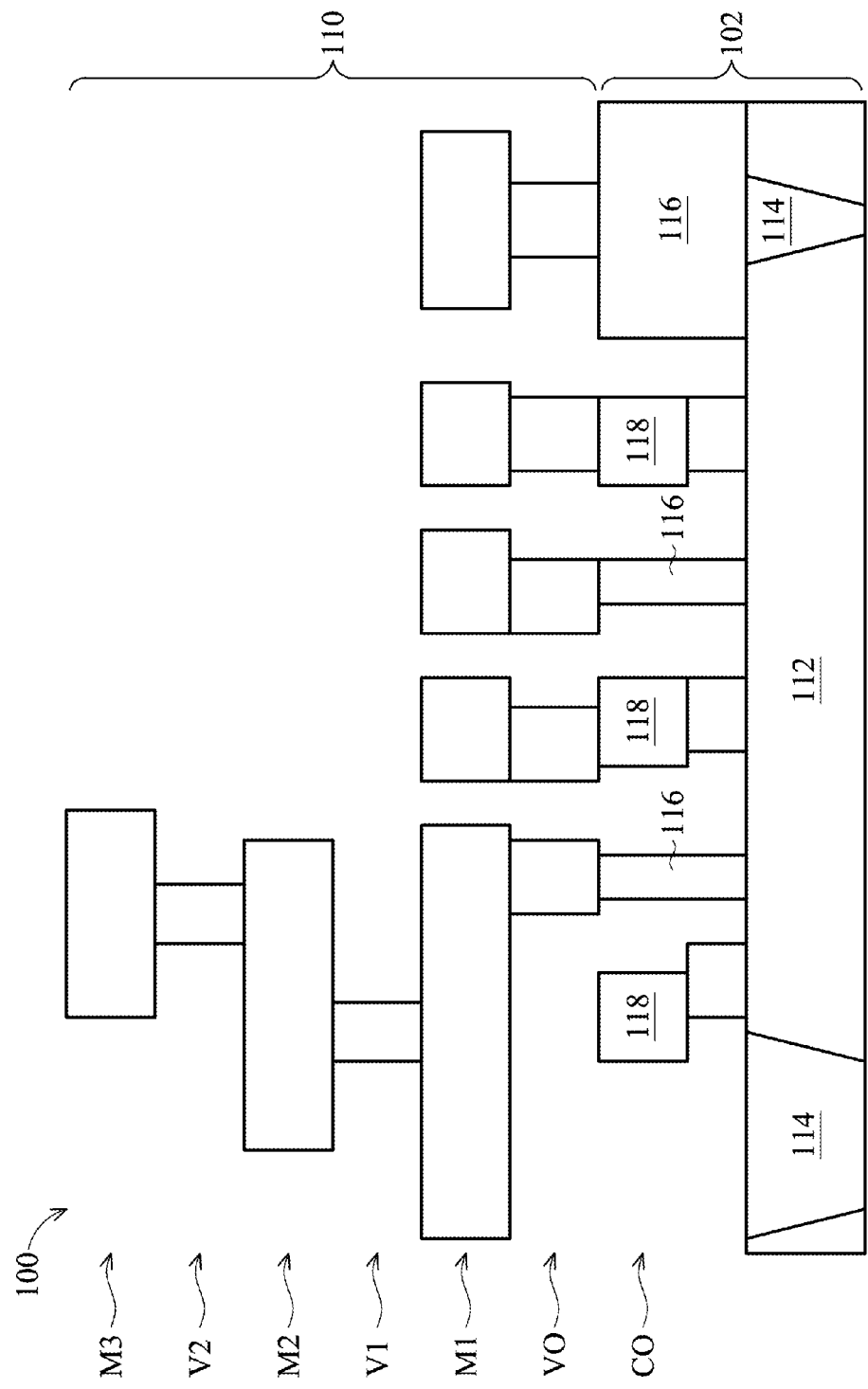
FIGS. 3A, 3B, and 3C are cross-sectional views of portions of the layouts shown in FIGS. 1 and 2.
Figure 3B:
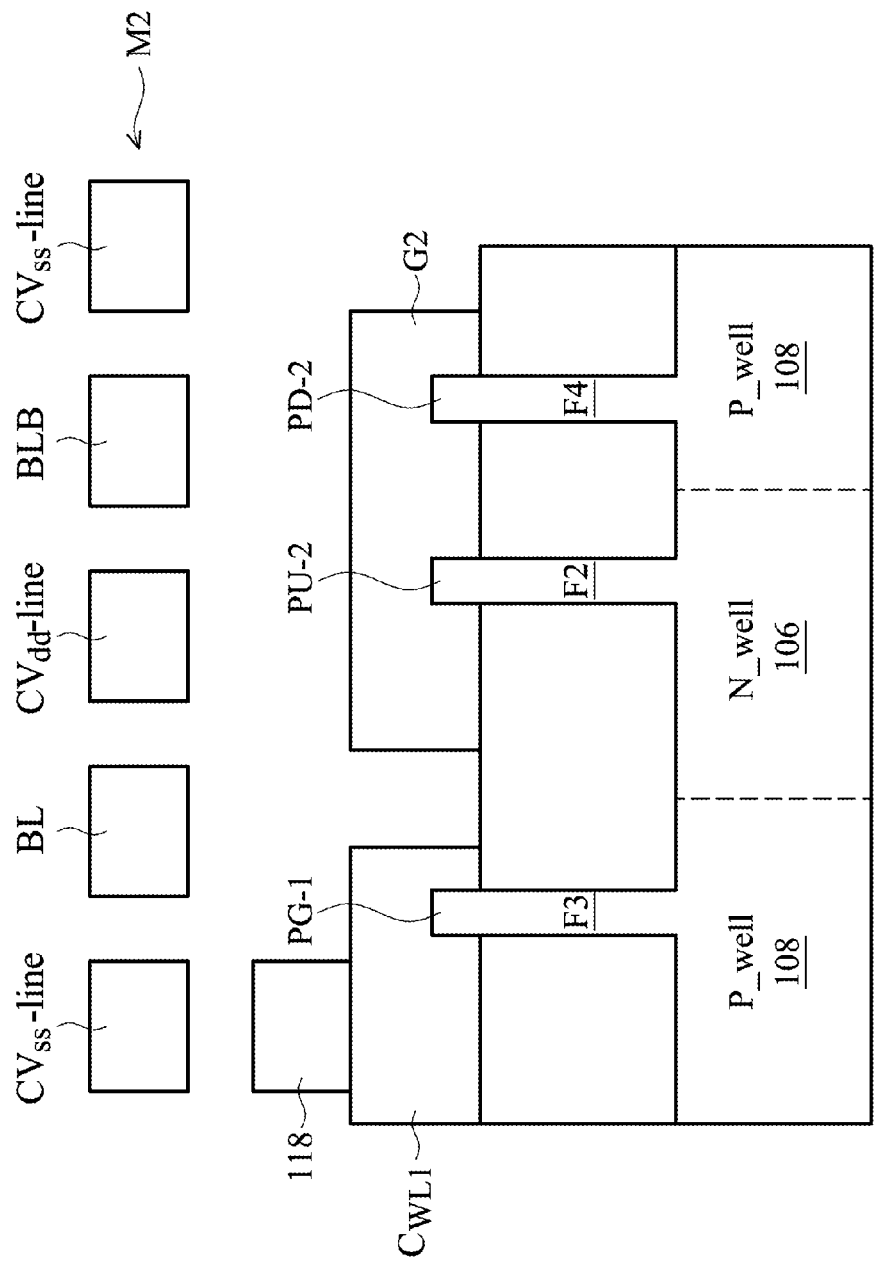
Figure 3C:
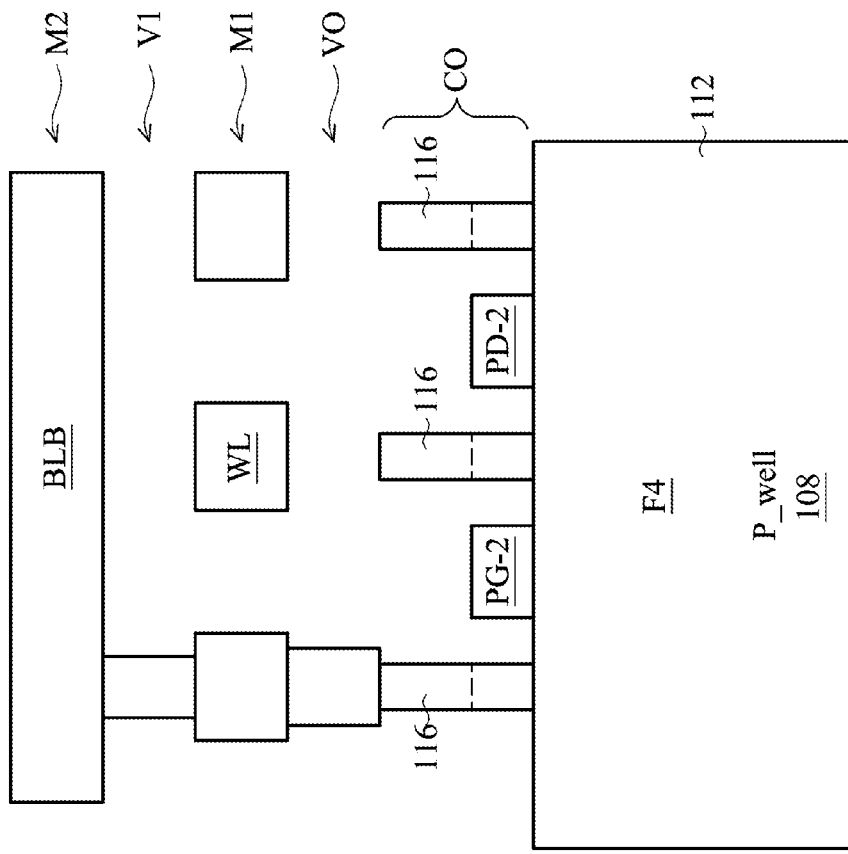

FIGS. 3A, 3B and 3C are cross-sectional views of portions of the layouts shown in FIGS. 1 and 2, illustrating some of the FEOL devices and BEOL metallization layers of the SRAM cell. FIG. 3A illustrates contacts and conductive segments formed in the metal layers M1, M2, and M3 and conductive vias formed in the via layers V0, V1, and V2 that connect the conductive segments to underlying components. A dielectric material (not shown) is formed between vias in each via layer V0, V1, and V2 and between contacts and conductive segments in each metal layer M1, M2, and M3. FIG. 3B shows a cross-section of fins F2, F3, and F4 and overlying metal layer M2. FIG. 3C shows a cross-section perpendicular to the view shown in FIG. 3B along a fin F4 and bit-line bar (BLB) in metal layer M2. Schematics 130 and 140 of the SRAM cell are shown in FIGS. 6 and 7.

Referring again to FIG. 1, the FEOL layout 102 for the novel SRAM cell will next be described in more detail. A layout 102 for a single SRAM cell is shown, with the boundary of an SRAM unit cell shown at 104. Each cell includes four fins F1, F2, F3, and F4. The fins F1, F2, F3, and F4 comprise fins of semiconductive material that are raised vertically away from the workpiece or substrate (see workpiece 112 of FIG. 3A) that the SRAM cell is formed over. The fins F1, F2, F3, and F4 comprise fins of FinFET devices. The fins F1, F2, F3, and F4 comprise active regions of transistors PU-1, PU-2, PD-1, PD-2, PG-1, and PG-2 beneath gate electrodes G1, G2, $C_{WL1}$ and $C_{WL2}$. The gate electrodes G1, G2, $C_{WL1}$ and $C_{WL2}$ comprise slot contacts and are also referred to herein as gate contacts. Gate electrodes $C_{WL1}$ and $C_{WL2}$ also function as contacts to word-lines WL in the BEOL and thus are also referred to herein as word-line contacts. The fins F1, F2, F3, and F4 also form source and drain regions on either side of the active regions of the transistors PU-1, PU-2, PD-1, PD-2, PG-1, and PG-2.

Fins F1 and F2 are bent beneath the gate electrodes G1 and G2 in the active regions of the fins F1 and F2, as shown, whereas fins F3 and F4 are straight beneath the gate electrodes $C_{WL1}$ and $C_{WL2}$. Fins F1 and F2 are discontinuous within the SRAM cell and do not extend completely across an SRAM cell boundary 104. In contrast, fins F3 and F4 extend completely from one edge of the SRAM cell boundary 104 to an opposite edge. Fins F3 and F4 are substantially straight along their entire length and are disposed on either side of fin F1 and fin F2, respectively.

The SRAM cell includes two pull-up transistors PU-1 and PU-2, two pull-down transistors PD-1 and PD-2, and two pass-gate transistors PG-1 and PG-2. Transistors PU-1, PD-1, and PG-1 are formed in a complementary arrangement to transistors PU-1, PD-2, and PG-2. A first pull-down transistor PD-1 is coupled to a first pull-up transistor PU-1, and a second pull-down transistor PD-2 is coupled to a second pull-up transistor PU-2. A first pass-gate transistor PG-1 is coupled to the first pull-down transistor PD-1, and a second pass-gate transistor PG-2 is coupled to the second pull-down transistor PD-2.

Various components such as contacts CVss-N1, which is a contact for Vss—node 1; CVdd-N1, a contact for Vdd—node 1; CVss-N2, a contact for Vss—node 2; CVdd-N2, a contact for Vdd—node 2; BL-N, a bit-line node contact; BLB-N, a bit-line bar node contact; DN, a data-node contact; SNB, a storage node bar contact; and butt contacts $C_{BUTT1}$, $C_{BUTT2}$, $C_{BUTT3}$, and $C_{BUTT4}$, are also shown in FIG. 1 that provide interconnections between the transistors, other components, and wiring of the SRAM cell. The contacts CVss-N1, CVdd-N1, CVss-N2, CVdd-N2, BL-N, BLB-N, DN, and SNB are elongated and comprise slot contacts in accordance with some embodiments.

For example, elongated contact data-node DN couples together the drain of the first pull-down transistor PD-1 and the drain of the first pull-up transistor PU-1. The elongated contact data-node DN couples together a drain node (not shown) of the first pull-down transistor PD-1 and a drain node (also not shown) of the first pull-up transistor PU-1, for example. Likewise, elongated contact storage-node bar SNB couples together the drain of the second pull-down transistor PD-2 and the drain of the second pull-up transistor PU-2. A source of the first pull-up transistor PU-1 is electrically coupled to a Vdd node using contact CVdd-N1, and a source of the first pull-down transistor PD-1 is electrically coupled to a Vss node using contact CVss-N1. Similar connections are made to the Vdd and Vss nodes for the second pull-up and pull-down transistors PU-2 and PD-2 using CVdd-N2 and CVss-N2, respectively.

The bended shape layout of the fins F1 an F2 results in a first active region distance comprising dimension $d_1$ between the Vdd node to the Vss node and a second active region distance comprising dimension $d_2$ between the drain nodes of the pull-up and pull-down transistors PU-1 and PD-1 (and also PU-2 and PD-2). The dimension $d_1$ may be larger than dimension $d_2$ by at least about 20% in some embodiments, for example.

Vias V0 are formed in a via layer to make connections between the layers, as shown in a cross-sectional view of the via layer V0 in FIG. 3A. The gate contacts and word-line contacts G1, G2, $C_{WL1}$ and $C_{WL2}$ may be formed in a contact layer CO that includes contacts 118. Other contacts 116 may also be formed to provide connections to the substrate 112 and other regions. Contacts 116 may be formed in a single step. Alternatively, contacts 116 may be formed in two steps, as shown in phantom in FIG. 3A; a lower portion of the contacts 116 may be formed in a first contact group layer, and an upper portion of the contacts 116 may be formed in a second contact group layer (e.g., in the same layer CO that contacts 118 are formed). Isolation regions 114 which may comprise shallow trench isolation or other insulating regions may be formed in the workpiece 112, e.g., between devices or memory cells.

FIG. 2 illustrates a top view of the BEOL layout 110 of the metal layers M1, V1, and M2 shown in FIGS. 3A, 3B, and 3C. Vias V1 provide connections between metal layers M1 and M2. Word-lines WL and landing pads are formed in the first metal layer M1. Contacts for Vdd line (CVdd-line), contacts for Vss-lines (CVss-lines), bit-lines BL, and bit-line bars BLB are formed in a second metal layer M2. A dielectric material (not shown) is disposed between the metal layers M1 and M2, and the vias V1 are formed in the dielectric material.

Referring again to FIG. 1, pull-up transistors PU-1 and PU-2 comprise fin-type metal oxide semiconductor field effect transistors (MOSFETs) in accordance with embodiments of the present disclosure. Pull-down transistors PD-1 and PD-2 may also comprise fin-type MOSFETs in some embodiments. Pass-gate transistors PG-1 and PG-2 may also comprise fin-type MOSFETs, for example. The pull-up transistors PU-1 and PU-2 are formed over an N-well 106 formed in the workpiece 112 and comprise p-type devices. Transistors PU-1 and PU-2 may comprise p channel metal oxide semiconductor (PMOS) devices, for example. The pull-down transistors PD-1 and PD-2 are formed over P-wells 108 and comprise n-type devices. Pass-gate transistors PG-1 and PG-2 are also formed over P-wells 108 and comprise n-type devices.

Pull-up transistor PU-1 and pull-down transistor PD-1 are connected to form a first inverter 132 (see the schematics in FIGS. 6 and 7), and pull-up transistor PU-2 and pull-down transistor PD-2 are connected to form a second inverter 134. The inverters 132 and 134 are cross-coupled; e.g., the output of the first inverter 132 is coupled to an input of the second inverter 134, and an output of the second inverter 134 is coupled to an input of the first inverter 132.

The novel SRAM cell layout utilizes both straight fins F3 and F4 and bended fins F1 and F2 in each cell, and uses slot contacts for cell local interconnects. The layout provides a reduced overall cell size due to the bent shape of the fins F1 and F2 of the pull-up transistors PU-1 and PU-2 and due to the layout. For example, the layout shape of the active regions for the pull-up transistors PU-1 and PU-2 comprise a bended line in a top view. The fins F1 and F2, and thus, the active regions of transistors PU-1 and PU-2 are disposed at a non-perpendicular angle beneath the gate electrodes G1 and G2. The remainder of the fins F1 and F2 are formed at a substantially perpendicular direction proximate the gate electrodes G1 and G2, respectively. For example, the fins F1 and F2 of semiconductive material of the pull-up transistors PU-1 and PU-2 are substantially perpendicular to the gate contacts G1 and G2 in regions other than the active regions of the pull-up transistors PU-1 and PU-2, i.e., in the source and drain regions of the transistors PU-1 and PU-2 formed in the fins F1 and F2 proximate the active regions.

The bent fins F1 and F2 of the pull-up transistors PU-1 and PU-2 efficiently use space on an integrated circuit die. Furthermore, the fins F3 and F4 of semiconductive material and gate contacts G1 and G2 are shared by the transistors PU-1, PU-2, PD-1, PD-2, PG-1, and PG-2, further increasing area efficiency. For example, portions of fin F3 function as active regions for both transistors PD-1 and PG-1, and portions of fin F4 function as active regions for both transistors PD-2 and PG-2. Portions of gate contact (or gate electrode) G1 function as a gate contact for transistors PU-1 and PD-1, and portions of gate contact G2 function as a gate contact for transistors PU-2 and PD-2.

Referring to both FIG. 1 and FIG. 2, a bit-line BL (FIG. 2) is coupled to the first pass-gate transistor PG-1 using bit-line node BL-N (FIG. 1), and a word-line WL is coupled to the first pass-gate transistor PG-1 using word-line contact $C_{WL1}$ which also functions as a gate electrode for the first pass-gate transistor PG-1. Bit-line bar BLB and the word-line WL are coupled to the second pass-gate transistor PG-2 using bit-line bar node BLB-N and word-line contact $C_{WL2}$ (which is also the gate electrode), respectively. A Vss-line is coupled to the first pull-down transistor PD-1 using contact CVss-N1, and the Vss-line is coupled to the second pull-down transistor PD-2 using contact CVss-N2. A Vdd-line is coupled to the first pull-up transistor PU-1 using contact CVdd-N1, and the Vdd-line is coupled to the second pull-up transistor PU-2 using contact CVdd-N2.

Figure 4:
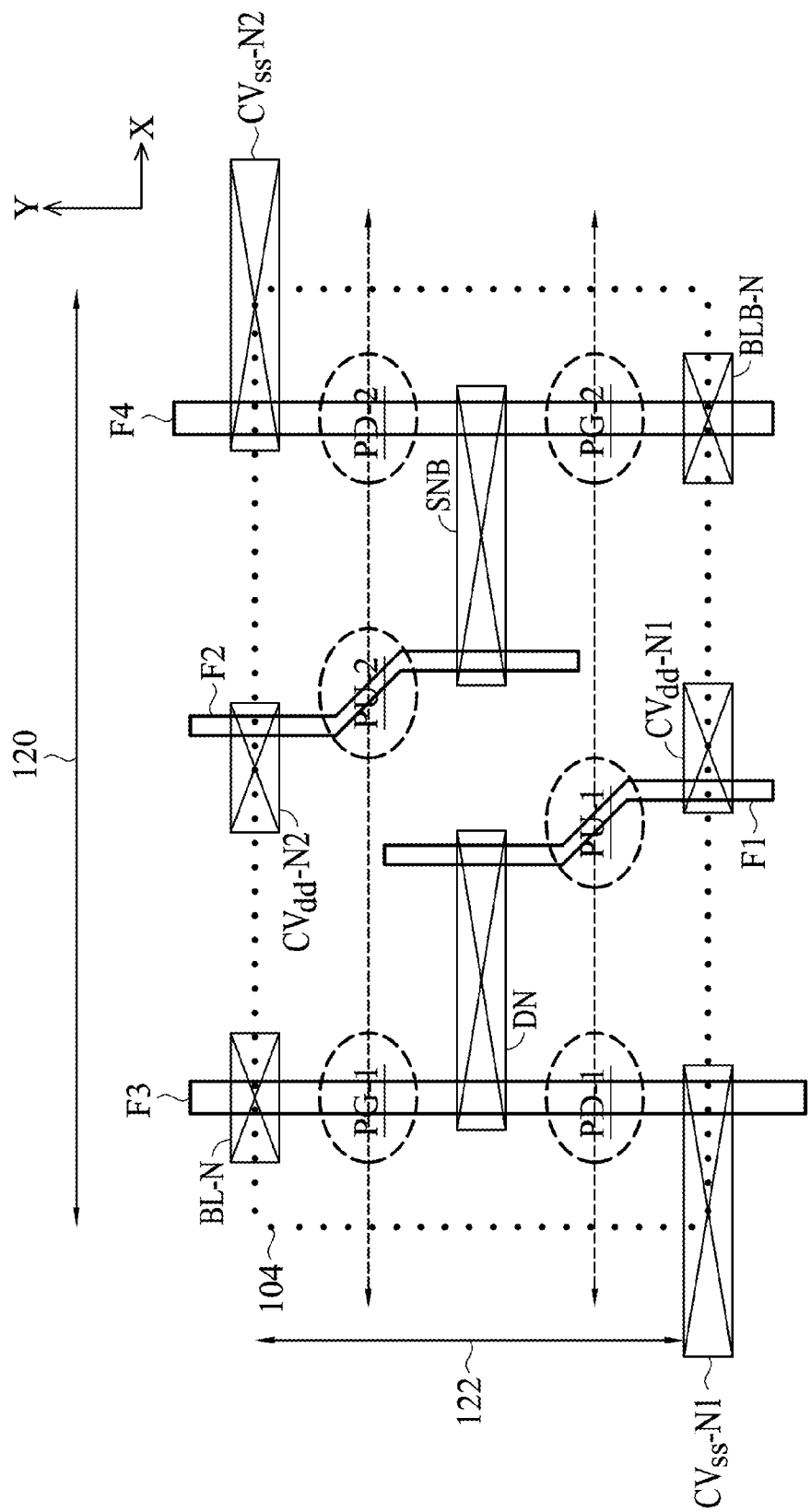
FIG. 4 illustrates orientation directions of the layout of FIG. 1.

FIG. 4 illustrates orientation directions of portions of the layout shown in FIG. 1. The SRAM cell is arranged on an x-pitch and a -y pitch. The contacts CVss-N1, CVdd-N1, CVss-N2, CVdd-N2, BL-N, BLB-N, DN, and SNB are arranged in a first direction 120 comprising an x direction or x-pitch. Fins F3 and F4 are arranged or oriented in a second direction 122 comprising a y direction or y-pitch. Non-bent portions of fins F1 and F2 are also oriented in the second direction 122. The second direction 122 is substantially perpendicular to the first direction 120.

FIG. 5 illustrates angles, directions, and dimensions of portions of the novel SRAM cell in accordance with embodiments. The bent portions of fins F1 and F2 are oriented in directions 124 and 125, respectively, which are different than the first direction 120 and the second direction 122. The bent portions of the fins F1 and F2 comprising the active regions of transistors PU-1 and PU-2, respectively, are oriented at an angle 126 that is non-perpendicular to the first direction 120. The active regions may be positioned at about a 35 to 80 degree angle with respect to the first direction 120 in some embodiments, for example.

The terms "first direction, second direction, and third direction" (and also additional directions) may be used interchangeably herein in order of introduction into particular sections of the present disclosure, such as in the claims.

For example, the gate contact G1 may comprise a slot contact that is disposed in a first direction 120, and the active region of the pull-up transistor PU-1 may be disposed in a second direction 124, the second direction 124 being different than the first direction 120. The second direction 124 is non-perpendicular to the first direction 120. The gate contact G2 may be disposed in the first direction 120, and the active region of the pull-up transistor PU-2 may be disposed in a third direction 125, the third direction 125 being different than the first direction 120. The third direction 125 is also non-perpendicular to the first direction 120. The third direction 125 may be different than the second direction 124, or the third direction 125 may comprise substantially the same direction as the second direction 124, for example.

The terms "first fin, second fin, third fin" and additional numbers of fins, and also the terms "first gate electrode, second gate electrode, third gate electrode," and additional numbers of gate electrodes, may also be used interchangeably herein in order of introduction into particular sections of the present disclosure, such as in the claims. For example, in one embodiment, an SRAM cell comprises a bit cell having an x-pitch and a y-pitch. The SRAM cell includes a first p-type device comprising first pull-up transistor PU-1 that includes a first gate electrode G1 disposed over a fin-type active region within first fin F1. The SRAM cell includes a first n-type device comprising first pull-down transistor PD-1 that includes the first gate electrode G1 disposed over a fin-type active region within a second fin F3. The SRAM cell includes a first pass-gate transistor PG-1 comprising a second gate electrode $C_{WL1}$ that is disposed over a fin-type active region within the second fin F3. A similar arrangement is followed for transistors PU-2, PD-2, and PG-2. The SRAM cell includes a second p-type device comprising second pull-up transistor device PU-2 that includes a third gate electrode G2 disposed over a fin-type active region within a third fin F2. The SRAM cell includes a second n-type device comprising the second pull-down device PD-2 comprising the third gate electrode G2 disposed over a fin-type active region within a fourth fin F4. The SRAM cell further includes a second pass-gate transistor PG-2 comprising a fourth gate electrode $C_{WL2}$ disposed over a fin-type active region within the fourth fin F4. A routing direction of the first gate electrode G1, the second gate electrode $C_{WL1}$, the third gate electrode G2, and the fourth gate electrode $C_{WL2}$ comprises a first direction. A routing direction of the fin-type active region within the first fin F1 disposed under the first gate electrode G1 comprises a second direction, the second direction being different than the first direction, and the second direction being non-perpendicular to the first direction. Each SRAM cell comprises a bit cell that further comprises a bit-line BL, a bit-line bar BLB, a word-line WL, a CVdd line, and a CVss line, wherein a routing direction of the bit-line BL and bit-line bar BLB comprises a third direction, and wherein a routing direction of the word-line WL comprises a fourth direction. The fourth direction is substantially parallel to the first direction, and the third direction is substantially perpendicular to the first direction. A cross-angle of the second direction to the first direction comprises an angle within a range of about 35 to 80 degrees.

FIG. 5 also illustrates that the bent fins F1 and F2 may comprise a different width on the straight portions that are aligned on the y pitch 122 than on the bent portion in the active regions. For example, fin F1 has a first width $w_1$ in a top view in the source and drain regions and a second width $w_2$ in the active regions that have a bend shape layout. The second width $w_2$ may be narrower than the first width $w_1$ by at least about 10% in some embodiments.

FIG. 6 is a schematic of the SRAM cell layout shown in FIGS. 1 and 2, illustrating electrical connections of a single port SRAM cell circuit. FIG. 7 is another schematic of the SRAM cell layout of FIGS. 1 and 2, functionally illustrating the inverters 132 and 134. The gates of the pass-gate transistors PG-1 and PG-2 are controlled by word-line WL that determines whether the current SRAM cell is selected or not. A latch formed of pull-up transistors PU-1 and PU-2 and pull-down transistors PD-1 and PD-2 stores a bit of data as a "0" or "1". The stored bit can be written into or read from the SRAM cell through bit-line BL and bit-line bar BLB. The SRAM cell is powered through a positive power supply node Vdd and power supply node Vss, which may be an electrical ground or power supply return.

Figure 8:
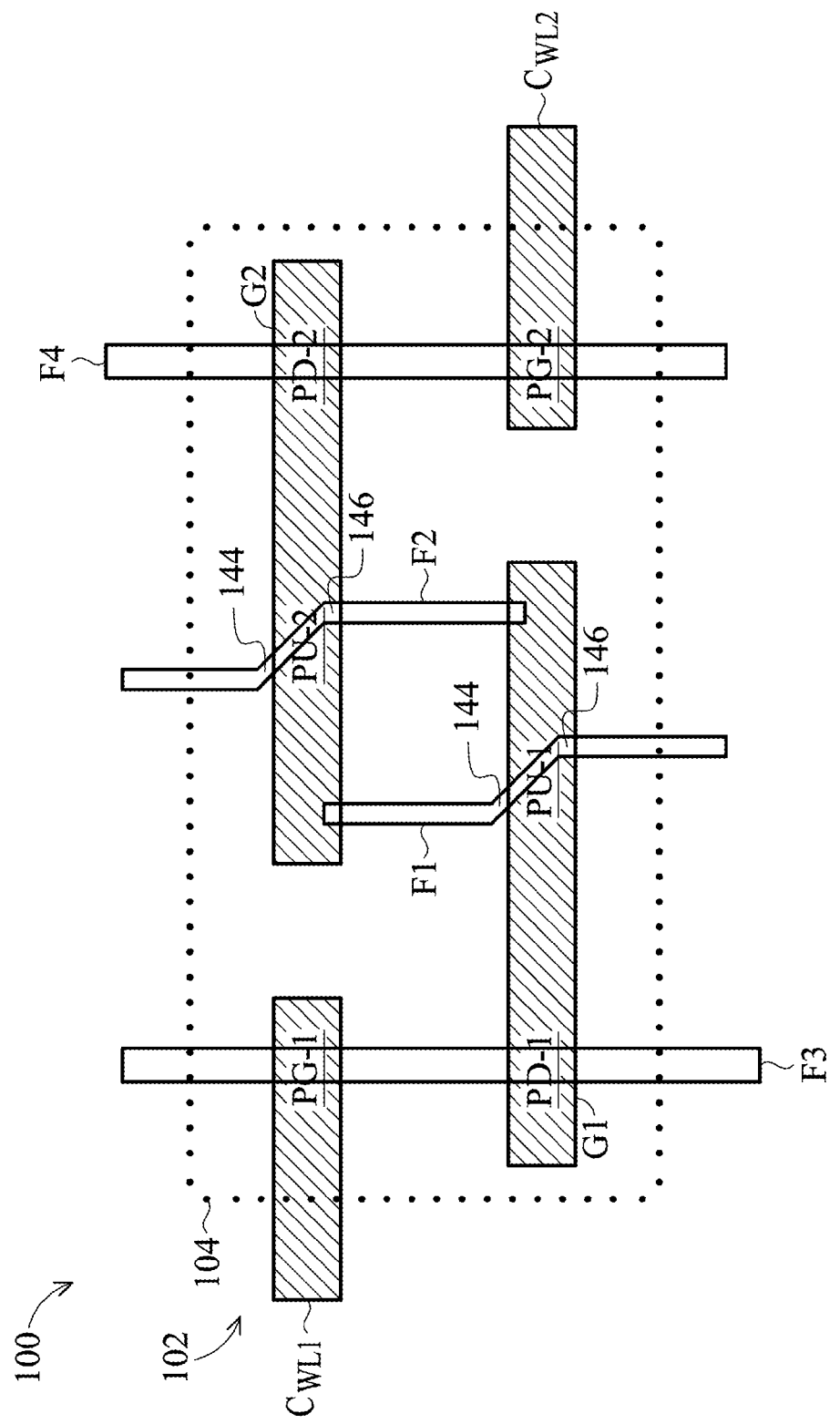
FIG. 8 illustrates effects of overlay misalignment of various material layers of embodiments described herein.

FIG. 8 illustrates effects of misalignment of the gate electrodes G1 and G2 to the fin F1 and F2 active regions of the embodiments described herein. Advantageously, the bent portion of the fins F1 and F2 provides an additional amount or length of active region for the transistors PU-1 and PU-2. The length of the fins F1 and F2 beneath the gate electrodes G1 and G2 is longer than if the fins F1 and F2 were unbent and went straight beneath the gate electrodes G1 and G2 at a perpendicular angle, for example. If the alignment of the fins F1 and F2 to the gate electrodes G1 and G2 is "off" or misaligned, resulting in misalignments 144 where a bent portion of the fins F1 and F2 does not reside beneath the gate electrodes G1 and G2 and misalignments 146 where a straight portion of the fins F1 and F2 resides beneath the gate electrodes G1 and G2, advantageously, device performance is not deleteriously affected, due to the longer active region created by the angled or bent portion of the fins F1 and F2.

Figure 9:
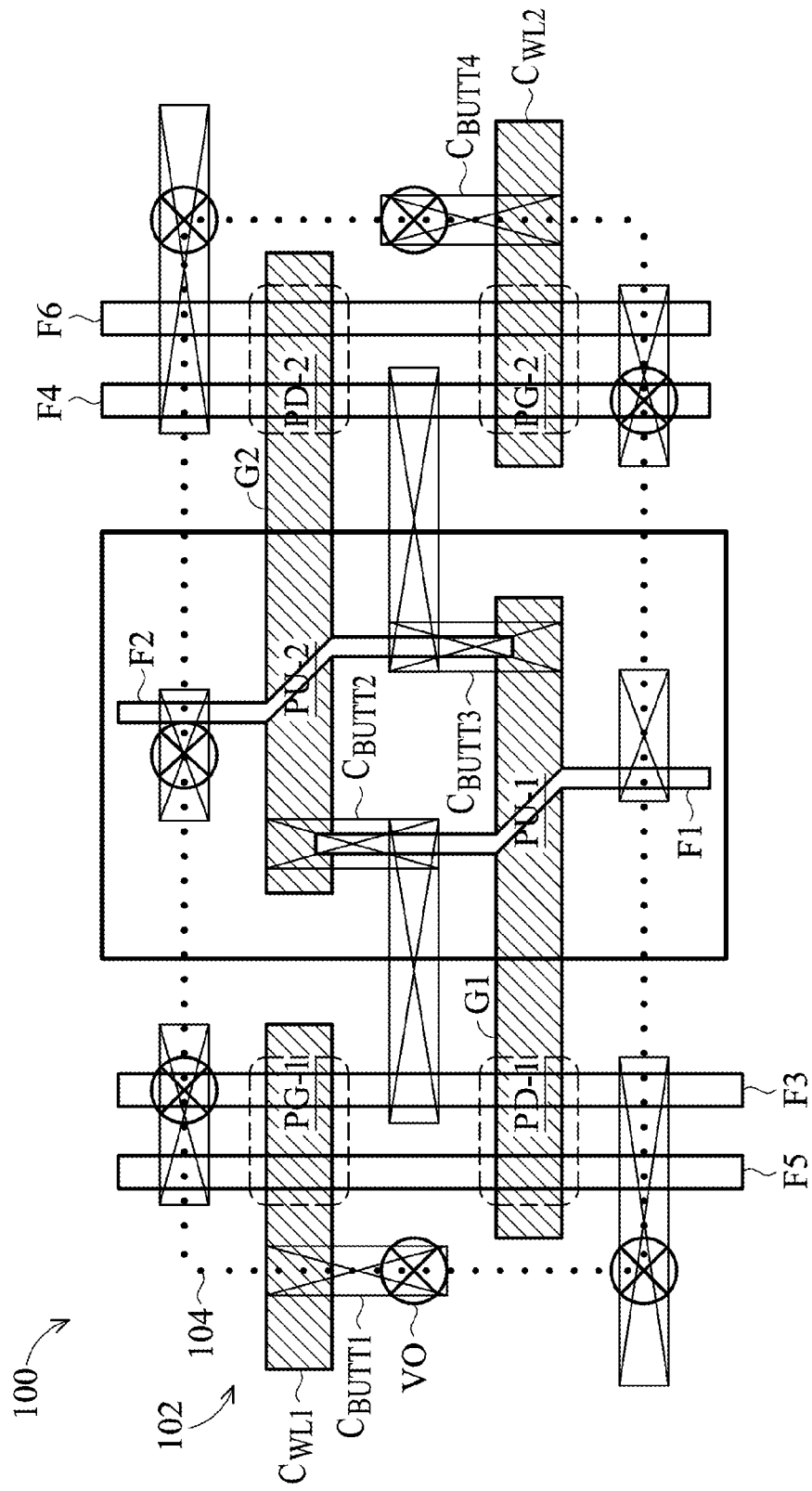
FIG. 9 shows a top view of another embodiment of an SRAM cell layout in accordance with the present disclosure.

Only one fin F1, F2, F3, and F4 is shown for each transistor PU-1, PU-2, PD-1, PD-2, PG-1, and PG-2 in FIG. 1; alternatively, the transistors PU-1, PU-2, PD-1, PD-2, PG-1, and PG-2 may comprise two or more fins. For example, FIG. 9 shows a top view of another embodiment of an SRAM cell layout in accordance with the present disclosure, wherein transistors PD-1 and PG-1, and PD-2 and PG-2 each comprise two fins F3 and F5, and F4 and F6, respectively. Transistors PU-1, PU-2, PD-1, PD-2, PG-1, and PG-2 may comprise one fin or multiple fins in accordance with embodiments. In some embodiments, transistors PU-1, PU-2, PD-1, PD-2, PG-1, and PG-2 may comprise about 1 to 16 fins, as an example. Alternatively, 17 or more fins may be used for each transistor.

Figure 10:
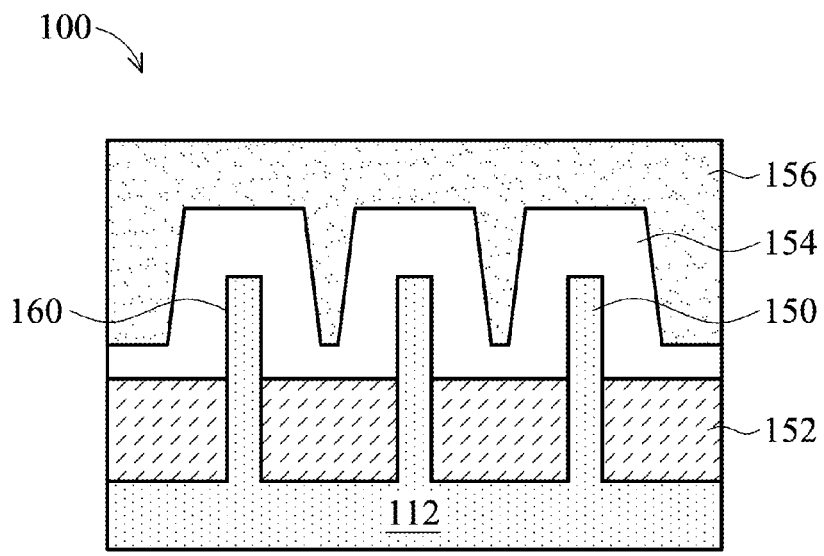
FIGS. 10 through 13 show cross-sectional views of the fins of FinFETs of transistors of the novel SRAM cells described herein.

FIGS. 10 through 13 show cross-sectional views of portions of the embodiments described herein, illustrating fins F1, F2, F3, F4, F5, or F6 (shown at 150 in FIGS. 10 through 13) of FinFETs of transistors PU-1, PU-2, PD-1, PD-2, PG-1, and PG-2 of the novel SRAM cells. The fins F1, F2, F3, F4, F5, and F6 may be manufactured using several methods and types of workpieces 112. In some embodiments, the workpiece 112 comprises a substrate comprising a bulk substrate, as shown in FIG. 10 in a cross-sectional view. The substrate 112 may comprise bulk Si, bulk SiP, bulk SiGe, bulk SiC, bulk Ge, or a combination thereof, for example. The fins 150 are formed from the workpiece 112 comprising the bulk substrate, and an insulating material 152 which may comprise a field oxide or other insulating material is disposed between the fins 150. A gate dielectric and a gate (shown collectively as a gate stack 154) are formed over the fins 150, and an insulating material 156 is formed over the gate stack 154. The active regions of the fins 150 are shown at 160.

Figure 11:
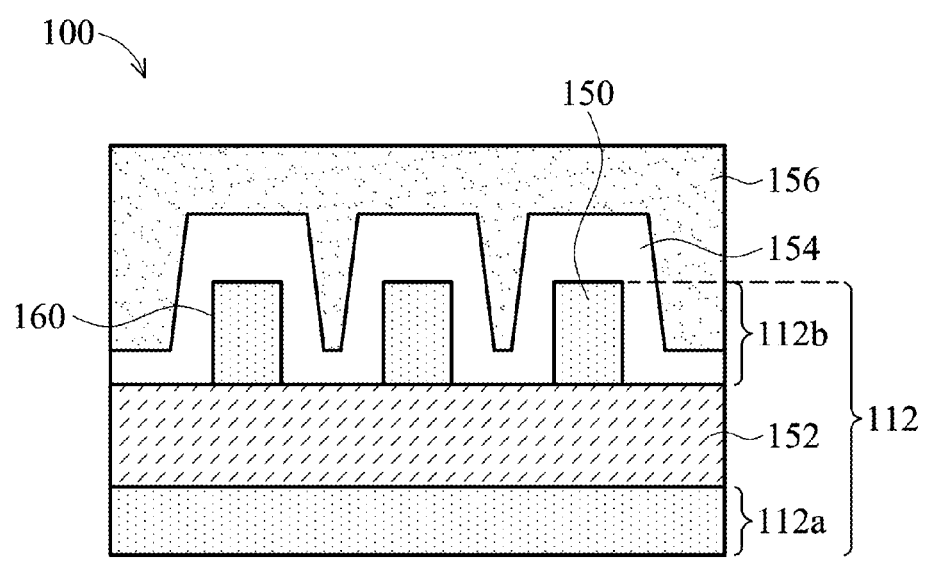

In other embodiments, the fins 150 may be formed from a workpiece 112 comprising a semiconductor-on-insulator (SOI) substrate, as shown in FIG. 11. The SOI substrate comprises two layers of semiconductor material 112a and 112b disposed on both sides of an insulating material 152. One layer of the semiconductor material 112b is patterned to form the fins 150 in this embodiment. The workpiece 112 may comprise a SOI-Si workpiece, a SOI-SiGe workpiece, or combinations thereof with a bulk substrate as described for FIG. 10, for example.

The gate dielectric of the gate stack 154 may comprise an oxide, an oxynitride, a high dielectric constant (k) material, or multiple layers or combinations thereof, as examples. The gate of the gate stack 154 may comprise polysilicon, polysilicon with silicide or metal layers, or multiple layers or combinations thereof, for example. If included, the silicide layers may comprise a refractory metal, nickel, cobalt, Pt, Ti, or a combination thereof, for example. The gate structures (e.g., gate stack 154) of the transistors PU-1, PU-2, PD-1, PD-2, PG-1, and PG-2 may comprise a polysilicon gate/SiON structure, a metal gate/high k dielectric structure, a silicide/metal/ high-k dielectric structure, or a combination thereof. Alternatively, the gate structures may comprise other materials.

Figure 12:
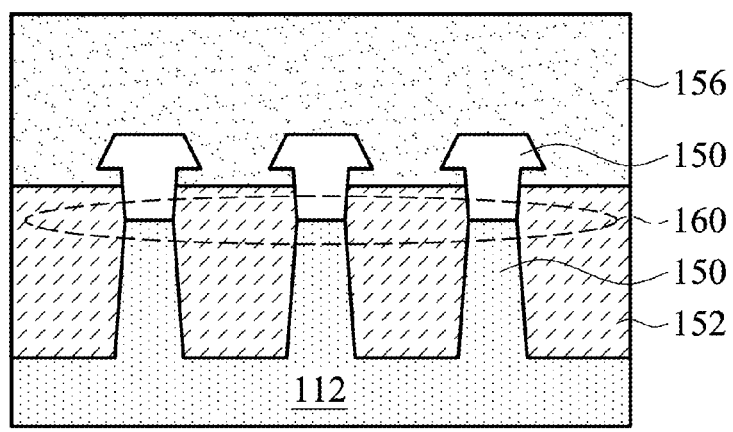
Figure 13:
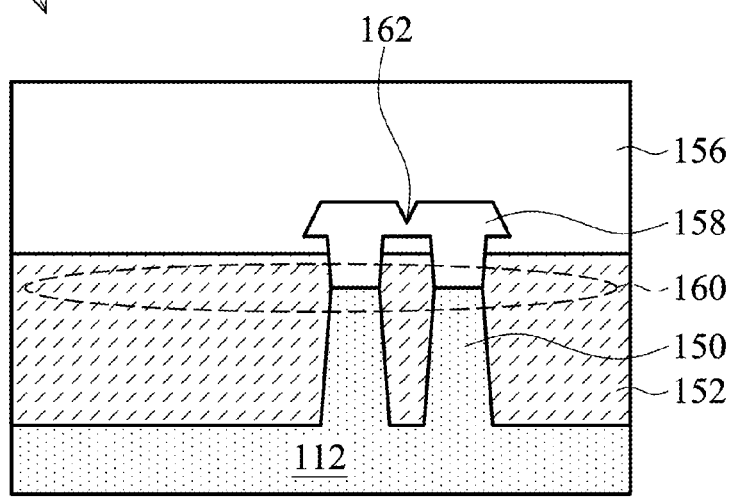

In some embodiments, the fins 150 may include an epitaxial layer 158 grown over the top surface thereof, as shown in FIGS. 12 and 13. The epitaxial layer 158 may include one or more dopants that are adapted to enhance mobility, for example. The epitaxial layer 158 may be non-merged for widely-spaced apart fins 150, as shown in FIG. 12, or the epitaxial layer 158 may be merged and may include merged regions 162 for closely-spaced fins 150, as shown in FIG. 13. Fin-type active regions 160 are disposed proximate the tops of the fins 150. Source and drain regions are formed on the fins 150 on either side of the active regions 160 (e.g., in and out of the paper in FIGS. 10 through 13), for example.

In some embodiments, the source regions and the drain regions of the transistors PG-1, PG-2, PD-1, and PD-2 may comprise a carbon (C) content epitaxial layer, a phosphorous (P) content epitaxial layer, a SiP epitaxial layer, a SiC epitaxial layer, or a combination thereof, for example. In other embodiments, the source regions and the drain regions of the transistors PU-1 and PU-2 may comprise a Ge-content epitaxial layer, a SiGe epitaxial layer, or a combination thereof, as another example. In yet other embodiments, the source regions and the drain regions of the transistors PU-1, PU-2, PD-1, PD-2, PG-1, and PG-2 may comprise a Si-content epitaxial layer disposed over the source and drain regions, and a silicide layer fully or partially formed over the Si-content epitaxial layer. Alternatively, the optional epitaxial layer over the source and drain regions may comprise other materials.

The SRAM cells may comprise a beta ratio 1 cell design, wherein the pull-down transistors PD-1 and PD-2 and the pass-gate transistors PG-1 and PG-2 comprise the same type of FinFET transistors, for example. The transistors PU-1, PU-2, PD-1, PD-2, PG-1, and PG-2 described herein may comprise 2D-FinFET structures, 3D-FinFET structures, or a combination thereof.

Embodiments of the present disclosure include the novel SRAM cells described herein. Embodiments also include SRAM cell arrays that include the SRAM cells. Multiple SRAM cells described herein may be arranged in rows and columns and addressed using the word-lines WL and bit-lines BL and BLB, for example. The SRAM cell arrays include Vdd lines and Vss lines for providing power to the SRAM cells. The SRAM cells include the novel transistors PU-1 and PU-2 that have active regions comprising the bent-shaped fins F1 and F2 described herein. Each SRAM cell in the array includes a first inverter 132 and a second inverter 134 that is cross-coupled with the first inverter 132. At least one transistor of each inverter 132 and 134 includes a pull-up transistor PU-1 and PU-2 having a bent-shaped fin F1 or F2 described herein. At least one transistor of each inverter 132 and 134 also includes a pull-down transistor PD-1 and PD-2 having an active region comprising a straight fin F3 or F4. Each SRAM cell in the array also includes two pass-gate transistors PG-1 and PG-2.

The gate electrodes of the first inverter 132 (e.g., the gate electrode G1 for the pull-up transistor PU-1 and the pull-down transistor PU-2), the gate electrode G2 of the second inverter 134, and the gate electrodes $C_{WL1}$ and $C_{WL2}$ of the pass-gate transistors PG-1 and PG-2, respectively, are disposed parallel to a routing direction of the plurality of word-lines WL, as can be seen in FIGS. 1 and 2, for each of the SRAM cells.

In accordance with one embodiment, an SRAM cell array includes a plurality of SRAM cells described herein wherein each SRAM cell comprises a bit cell having an x-pitch and a y-pitch. Each SRAM cell comprises a first Vss (CVss) node, a second CVss node, a first Vdd (CVdd) node, a second CVdd node, a first N data-node, a first P data-node bar comprising the drain regions of transistors PU-1 and PD-1 that are connected by contact DN, a first N data-node-bar, a first P data-node-bar comprising drain regions of transistors PU-2 and PD-2 that are connected by contact SNB, a plurality of cell contacts, and a plurality of cell devices comprising transistors PU-1, PU-2, PD-1, PD-2, PG-1, and PG-2. The plurality of cell contacts function as a connection path between a via hole to an active region that substantially follows a first routing direction. The plurality of cell contacts comprises: a first elongated contact CVdd-N1 coupled to the first CVdd node;

a second elongated contact CVdd-N2 coupled to the second CVdd node; a third elongated contact CVss-N1 coupled to the first CVss node; a fourth elongated contact CVss-N2 coupled to the second CVss node; a fifth elongated contact DN coupled to both the first P data-node and the first N data-node; and a sixth elongated contact SNB coupled to both a second P data-node-bar and a second N data-node-bar. The first elongated contact CVdd-N1 and the third elongated contact CVss-N1 have a projection overlay in the x-pitch direction, and the second elongated contact CVdd-N2 and the fourth elongated contact CVss-N2 have a projection overlay in the x-pitch direction (see FIG. 4 for illustrations of projection overlay in the x and y directions). The third elongated contact CVss-N1 and the fifth elongated contact DN have a partial projection overlay in the y-pitch direction, and the fourth elongated contact CVss-N2 and the sixth elongated contact SNB have a partial projection overlay in the y-pitch direction. There is no overlay for the first elongated contact CVdd-N1 and the fifth elongated contact DN in the y-pitch direction, and there is no overlay projection for the first elongated contact CVdd-N1 and the sixth elongated contact SNB in the y-pitch direction. The first inverter 132 includes a first pull-up device PU-1 coupled to a first pull-down device PD-1, and the second inverter 134 includes a second pull-up device PU-2 coupled to a second pull-down device PD-2. The first pull-up device PU-1 comprises a first gate electrode G1 disposed over an active region that is a bent portion of a first fin F1, and the first pull-down device PD-1 comprises the first gate electrode G1 disposed over an active region that is a portion of a straight second fin F3. The first pass-gate transistor PG-1 comprises a second gate electrode $C_{WL1}$ disposed over the second active region that is a portion of the straight second fin F3. The second pull-up device PU-2 comprises a third gate electrode G2 disposed over an active region that is a bent portion of a third fin F2. The second pull-down device PD-2 comprises the third gate electrode G2 disposed over an active region that is a portion of a straight fourth fin F4. The second pass-gate transistor PG-2 comprises a fourth gate electrode $C_{WL2}$ disposed over the fourth active region that is a portion of straight fin F4. A routing direction of the first gate electrode G1, the second gate electrode $C_{WL1}$, the third gate electrode G2, and the fourth gate electrode $C_{WL2}$ comprises a first direction 120 that is oriented in the x pitch (see FIG. 5). A routing direction of the first active region disposed beneath the first gate electrode G1 comprises a second direction 124, the second direction 124 being different than the first direction 120. Each bit cell further comprises a bit-line BL, a bit-line bar BLB, a word-line WL, a CVdd line and a CVss line. A routing direction of the bit-line BL and bit-line bar BLB comprises a third direction (e.g., oriented in the y pitch: see FIG. 2), and a routing direction of the word-line WL comprises a fourth direction (e.g., oriented in the x pitch), wherein the fourth direction is substantially parallel to the first direction 120, wherein the third direction is substantially perpendicular to the first direction 120. Each bit cell further comprises a first butt contact $C_{BUTT2}$ coupled to the third gate electrode G2 and the fifth elongated contact DN and a second butt contact $C_{BUTT3}$ coupled to the first gate electrode G1 and the sixth elongated contact SNB.

Each bit cell further comprises a bit-line node, a bit-line bar node, a seventh contact coupled between the bit-line node and the overlying bit-line BL, an eighth contact coupled between the bit-line bar node and the overlying bit-line bar BLB, wherein the seventh contact and the eighth contact are vias located in a first contact group layer (e.g., below contact layer CO in FIG. 3A). Each bit cell further comprises a second contact group layer disposed over the first contact group layer (e.g., in the same contact layer CO that contacts 118 are formed in FIG. 3A), wherein the second contact group layer includes a ninth contact coupled to the first elongated contact CVdd-N1, a tenth contact coupled to the second elongated contact CVdd-N2, an eleventh contact coupled to the third elongated contact CVss-N1, a twelfth contact coupled to the fourth elongated contact CVss-N2, a thirteenth contact coupled the seventh contact, and a fourteenth contact coupled to the eighth contact.

Advantages of embodiments of the disclosure include providing novel SRAM cell layouts that are area-efficient and provide a smaller SRAM cell that is reduced in size, saving real estate on an integrated circuit die. More SRAM cells may be placed on a chip in accordance with embodiments described herein. A wide process margin is achieved due to the elongated contacts of the novel SRAM cells. The contact line end to fin active region landing area is increased, and the contact line end process margin is also increased. The novel SRAM cells have low contact resistance and increased stability. A wide misalignment margin between contact layers and active layers is also achieved. Aggressive layout rules are achieved regarding line end extension to active regions and line end to line end spacing. The novel SRAM cell structures and designs are easily implementable in manufacturing process flows.

In accordance with one embodiment of the present disclosure, an SRAM cell includes a pull-up transistor. The pull-up transistor includes a FinFET that has a fin of semiconductive material. An active region is disposed within the fin. A contact is disposed over the active region of the pull-up transistor. The contact is a slot contact that is disposed in a first direction. The active region of the pull-up transistor is disposed in a second direction. The second direction is non-perpendicular to the first direction.

In accordance with another embodiment, an SRAM cell includes a first inverter comprising a first n-type device and a first p-type device. The first p-type device comprises a fin-type MOSFET and has a bend shape layout in an active region. The SRAM cell includes a first gate electrode disposed over the active region of the first p-type device. The SRAM cell also includes a second inverter comprising a second n-type device and a second p-type device. The second p-type device comprises a fin-type MOSFET and has a bend shape layout in an active region. A second gate electrode is disposed over the active region of the second p-type device. An output of the first inverter is coupled to an input of the second inverter, and an output of the second inverter is coupled to an input of the first inverter.

In accordance with yet another embodiment, an SRAM cell array is disclosed. The SRAM cell array has a plurality of SRAM cells that are arranged in a plurality of rows and columns. The SRAM cell array includes a Vdd line and a Vss line for providing power to the plurality of SRAM cells. The SRAM cell array includes a plurality of bit-lines and a plurality of bit-line bars for accessing a column of the plurality of columns, and a plurality of word-lines for accessing a row of the plurality of rows. Each SRAM cell in the SRAM cell array comprises a first inverter including a first p-type device having an active region comprising a bent-shaped fin, and a second inverter cross-coupled with the first inverter, the second inverter including a second p-type device having an active region comprising a bent-shaped fin. Each SRAM cell also includes a first pass-gate transistor coupled to the first inverter, and a second pass-gate transistor coupled to the second inverter.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A static random access memory (SRAM) cell, comprising:
   a pull-up transistor, the pull-up transistor comprising a Fin field effect transistor (FinFET) including a fin of semiconductive material, wherein the fin comprises:
      a first substantially straight portion disposed in a first direction, wherein a first source or drain region of the FinFET is disposed within the first substantially straight portion of the fin;
      a second substantially straight portion disposed in the first direction, wherein a second source or drain region of the FinFET is disposed within the second substantially straight portion of the fin; and
      a third substantially straight portion connecting the first and the second substantially straight portions, wherein the third substantially straight portion is disposed in a second direction different than and non-perpendicular to the first direction, and wherein an active region of the finFET is disposed within the third substantially straight portion of the fin; and
   a contact disposed over the active region of the pull-up transistor, wherein the contact comprises a slot contact disposed in a third direction, wherein the second direction is non-perpendicular to the third direction, wherein a minimum distance between the first and the second source or drain region across the contact is larger than a width of the contact, and wherein the contact substantially covers all of the third substantially straight portion.

2. The SRAM cell according to claim 1, wherein the pull-up transistor comprises a p channel metal oxide semiconductor (PMOS) device, wherein the pull-up transistor comprises a first pull-up transistor, and wherein the contact comprises a first contact, further comprising:
   a second pull-up transistor comprising a FinFET; and
   a second contact disposed over an active region of the second pull-up transistor, wherein the second contact comprises a slot contact disposed in the third direction, wherein the active region of the second pull-up transistor is disposed in a fourth direction, wherein the fourth direction is non-perpendicular to the third direction.

3. The SRAM cell according to claim 2, wherein the fin of the first pull-up transistor comprises a first fin, wherein a fin of the second pull-up transistor comprises a second fin, the first fin and the second fin comprising a bend shape in the active regions, further comprising:
   a first pull-down transistor coupled to the first pull-up transistor;
   a second pull-down transistor coupled to the second pull-up transistor;
   a first pass-gate transistor coupled to the first pull-down transistor; and
   a second pass-gate transistor coupled to the second pull-down transistor, wherein active regions of the first pass-gate transistor and the first pull-down transistor comprise a third fin of semiconductive material, wherein active regions of the second pass-gate transistor and the second pull-down transistor comprise a fourth fin of semiconductive material, and wherein the third fin and the fourth fin are substantially straight and are disposed on either side of the first fin and the second fin, respectively.

4. The SRAM cell according to claim 1, wherein the second direction is positioned at about a 35 to 80 degree angle with respect to the third direction.

5. A static random access memory (SRAM) cell, comprising:
   a first inverter comprising a first n-type device and a first p-type device comprising a fin-type metal oxide semiconductor field effect transistor (MOSFET), the first p-type device comprising a first bend shape layout in an active region, wherein the first bend shape layout comprises:
      a first substantially straight portion of a fin;
      a second substantially straight portion of the fin; and
      a third substantially straight portion of the fin connecting the first and the second substantially straight portions of the fin, wherein the third substantially straight portion of the fin is disposed in a different and non-perpendicular direction with respect to the first and the second substantially straight portions of the fin;
   a first gate electrode disposed over the active region of the first p-type device, wherein the first gate electrode substantially covers all of the third substantially straight portion of the fin;
   a second inverter comprising a second n-type device and a second p-type device comprising a fin-type MOSFET, the second p-type device comprising a second bend shape layout in an active region; and
   a second gate electrode disposed over the active region of the second p-type device, wherein an output of the first inverter is coupled to an input of the second inverter, and wherein an output of the second inverter is coupled to an input of the first inverter.

6. The SRAM cell according to claim 5, wherein the first n-type device comprises at least one fin-type MOSFET having a drain, wherein the second n-type device comprises at least one fin-type MOSFET having a drain, wherein the first p-type device and the second p-type device each comprise a drain, further comprising:
   a first elongated contact coupling together the drain of the first n-type device and the drain of the first p-type device; and
   a second elongated contact coupling together the drain of the second n-type device and the drain of the second p-type device.

7. The SRAM cell according to claim 6, wherein the first elongated contact couples together a drain node of the first n-type device and a drain node of the first p-type device, wherein a source of the first p-type device is electrically coupled to a Vdd node, wherein a source of the first n-type device is electrically coupled to a Vss node, and wherein a first distance between the Vdd node and the Vss node is greater than a second distance between the drain node of the first n-type device and the drain node of the first p-type device by at least about 20%.

8. The SRAM cell according to claim 5, wherein the SRAM cell comprises a bit cell having an x-pitch and a y-pitch, wherein the first p-type device comprises a first pull-up transistor comprising a first gate electrode disposed over a fin-type active region within a first fin, wherein the first n-type device comprises a first pull-down transistor comprising the first gate electrode disposed over a fin-type active region within a second fin, wherein the SRAM cell further includes a first pass-gate transistor comprising a second gate electrode disposed over a fin-type active region within the second fin, wherein the second p-type device comprises a second pull-up transistor comprising a third gate electrode disposed over a fin-type active region within a third fin, wherein the second n-type device comprises a second pull-down transistor comprising the third gate electrode disposed over a fin-type active region within a fourth fin, wherein the SRAM cell further includes a second pass-gate transistor comprising a fourth gate electrode disposed over the a fin-type active region within the fourth fin, wherein a routing direction of the first gate electrode, the second gate electrode, the third gate electrode, and the fourth gate electrode comprises a first direction, and wherein a routing direction of the fin-type active region within the first fin disposed under the first gate electrode comprises a second direction, the second direction being different than the first direction, the second direction being non-perpendicular to the first direction.

9. The SRAM cell according to claim 8, wherein each bit cell further comprises a bit-line, a bit-line bar, a word-line, a CVdd line and a CVss line, wherein a routing direction of the bit-line and bit-line bar comprises a third direction, wherein a routing direction of the word-line comprises a fourth direction, wherein the fourth direction is substantially parallel to the first direction, wherein the third direction is substantially perpendicular to the first direction, and wherein a cross-angle of the second direction to the first direction comprises an angle within a range of about 35 to 80 degrees.

10. The SRAM cell according to claim 5, further comprising a first pass-gate transistor coupled to the first inverter, a second pass-gate transistor coupled to the second inverter, a bit-line and a word-line coupled to the first pass-gate transistor, a bit-line bar and the word-line coupled to the second pass-gate transistor, a Vss-line coupled to the first n-type device and the second n-type device, and a Vdd-line coupled to the first p-type device and the second p-type device.

11. The SRAM cell according to claim 5, wherein the first p-type device or the second p-type device comprises a pull-up transistor comprising source or drain regions having a first width and a channel region having a second width, wherein the second width is narrower than the first width by at least about 10%.

12. A static random access memory (SRAM) cell array having a plurality of SRAM cells arranged in a plurality of rows and columns, the SRAM cell array comprising:
    a Vdd line and a Vss line for providing power to the plurality of SRAM cells;
    a plurality of bit-lines and a plurality of bit-line bars for accessing a column of the plurality of columns; and
    a plurality of word-lines for accessing a row of the plurality of rows, wherein each SRAM cell in the SRAM cell array comprises:
        a first inverter including a first p-type device having an active region comprising a bent-shaped fin,
        a second inverter cross-coupled with the first inverter, the second inverter including a second p-type device having an active region comprising a bent-shaped fin,
        a first pass-gate transistor coupled to the first inverter, and
        a second pass-gate transistor coupled to the second inverter; and
    the plurality of SRAM cells each comprising a bit cell, each bit cell comprising:
        a first Vss (CVss) node;
        a second CVss node;
        a first Vdd (CVdd) node;
        a second CVdd node;
        a bit bar node;
        a bit-line bar node;
        a bit-line overlying the bit bar node;
        a bit-line bar overlying the bit-line bar node; and
        a plurality of cell contacts, wherein the plurality of cell contacts comprise:
            a first elongated contact coupled to the first CVdd node;
            a second elongated contact coupled to the second CVdd node;
            a third elongated contact coupled to the first VCss node;
            a fourth elongated contact coupled to the second CVss node;
            a seventh contact coupled between the bit line node and the bit-line;
            an eighth contact coupled between the bit-line bar node and the bit-line bar, wherein the seventh contact and the eighth contact are located in a first contact group layer, wherein each bit cell further comprises a second contact group layer disposed over the first contact group layer, and wherein the second contact group layer includes a ninth contact coupled to the first elongated contact, a tenth contact coupled to the second elongated contact, an eleventh contact coupled to the third elongated contact, a twelfth contact coupled to the fourth elongated contact, a thirteenth contact coupled the seventh contact, and a fourteenth contact coupled to the eighth contact.

13. The SRAM cell array according to claim 12, wherein each bit cell comprises an x-pitch and a y-pitch and further comprises a first N data-node, a first P data-node, a first N data-node-bar, a first P data-node-bar, wherein the plurality of cell contacts function as a connection path between a via hole to an active region that substantially follows a first routing direction, wherein the plurality of cell contacts further comprises: a fifth elongated contact coupled to both the first P data-node and the first N data-node; and a sixth elongated contact coupled to both a second P data-node-bar and a second N data-node-bar: wherein the first elongated contact and the third elongated contact have a projection overlay in the x-pitch direction, wherein the second elongated contact and the fourth elongated contact have a projection overlay in the x-pitch direction, wherein the third elongated contact and the fifth elongated contact have a partial projection overlay in the y-pitch direction, wherein the fourth elongated contact and the sixth elongated contact have a partial projection overlay in the y-pitch direction, wherein there is no overlay for the first elongated contact and the fifth elongated contact in the y-pitch direction, wherein there is no projection overlay for the first elongated contact and sixth elongated contact in the y-pitch direction; wherein the first inverter includes a first pull-up device coupled to a first pull-down device, wherein the second inverter includes a second pull-up device coupled to a second pull-down device, wherein the first pull-up device comprises a first gate electrode disposed over an active region that is a bent portion of a first fin, wherein the first pull-down device comprises the first gate electrode disposed over an active region that is a portion of a second fin, wherein the first pass-gate transistor comprises a second gate electrode disposed over an active region that is a portion of the second fin, wherein the second pull-up device comprises a third gate electrode disposed over an active region that is a bent portion of a third fin, wherein the second pull-down device comprises the third gate electrode disposed over an active region that is a portion of a fourth fin, wherein the second pass-gate transistor comprises a fourth gate electrode disposed over an active region that is a portion of the fourth fin, wherein a routing direction of the first gate electrode, the second gate electrode, the third gate electrode, and the fourth gate electrode comprises a first direction, wherein a routing direction of a first active region disposed beneath the first gate electrode comprises a second direction, the second direction being different than the first direction; wherein each bit cell further comprises, a word-line, a CVdd line and a CVss line; wherein a routing direction of the bit-line and bit-line bar comprises a third direction, wherein a routing direction of the word-line comprises a fourth direction, wherein the fourth direction is substantially parallel to the first direction, wherein the third direction is substantially perpendicular to the first direction; and wherein each bit cell further comprises a first butt contact coupled to the third gate electrode and the fifth elongated contact and a second butt contact coupled to the first gate electrode and the sixth elongated contact.

14. The SRAM cell array according to claim 13, wherein a layout shape of a second active region and a third active region comprises a bended line, wherein each bended line is discontinuous within each SRAM cell and does not extend completely across an SRAM cell boundary.

15. The SRAM cell array according to claim 12, wherein gate electrodes of the first inverter, the second inverter, the first pass-gate transistor, and the second pass-gate transistor are disposed parallel to a routing direction of the plurality of word-lines.

16. The SRAM cell array according to claim 12, wherein transistors of the first inverter or the second inverter, the first pass-gate transistor, or the second pass-gate transistor include:
a Si-content epitaxial layer disposed over source regions and drain regions; and
a silicide layer fully or partially formed over the Si-content epitaxial layer.

17. The SRAM cell array according to claim 12, wherein source regions and drain regions of the transistors of the first inverter, the second inverter, the first pass-gate transistor, or the second pass-gate transistor comprise a carbon (C) content epitaxial layer, a phosphorous (P) content epitaxial layer, a SiP epitaxial layer, a SiC epitaxial layer, or a combination thereof, or wherein source regions and drain regions of the transistors of the first inverter or the second inverter comprise a Ge-content epitaxial layer, a SiGe epitaxial layer, or a combination thereof.

18. The SRAM cell array according to claim 12, wherein transistors of the first inverter and the second inverter comprise a single fin or multiple fins.

19. The SRAM cell array according to claim 12, wherein the plurality of word-lines are disposed in a first metal layer, further comprising a dielectric material disposed over the first metal layer, and wherein the plurality of bit-lines, the plurality of bit-line bars, contacts for the Vdd line, and contacts for the Vss line are disposed in a second metal layer, the second metal layer being disposed over the dielectric material.

* * * * *